(12) United States Patent
Backhausen et al.

(10) Patent No.: US 9,569,354 B2
(45) Date of Patent: Feb. 14, 2017

(54) SYSTEM AND METHOD TO EMULATE AN ELECTRICALLY ERASABLE PROGRAMMABLE READ-ONLY MEMORY

(71) Applicant: Infineon Technologies AG, Neubiberg (DE)

(72) Inventors: Ulrich Backhausen, Taufkirchen (DE); Thomas Kern, Munich (DE); Thomas Nirschl, Putzbrunn (DE); Jens Rosenbusch, Munich (DE); Xiangting Bi, Munich (DE); Edvin Paparisto, Munich (DE)

(73) Assignee: Infineon Technologies AG, Neubiberg (DE)

( * ) Notice: Subject to any disclaimer, the term of this patent is extended or adjusted under 35 U.S.C. 154(b) by 271 days.

(21) Appl. No.: 13/957,604

(22) Filed: Aug. 2, 2013

(65) Prior Publication Data

US 2015/0039805 A1 Feb. 5, 2015

(51) Int. Cl.
*G06F 12/02* (2006.01)
*G06F 11/10* (2006.01)
*G11C 29/18* (2006.01)

(52) U.S. Cl.
CPC ....... *G06F 12/0246* (2013.01); *G06F 11/1048* (2013.01); *G06F 12/0238* (2013.01); *G06F 12/0292* (2013.01); *G06F 2212/1032* (2013.01); *G06F 2212/7201* (2013.01); *G06F 2212/7207* (2013.01); *G11C 2029/1806* (2013.01)

(58) Field of Classification Search
None
See application file for complete search history.

(56) References Cited

U.S. PATENT DOCUMENTS

| 2003/0149856 | A1* | 8/2003 | Cernea | 711/202 |
|---|---|---|---|---|
| 2006/0282610 | A1* | 12/2006 | Dariel | G06F 3/0616 711/103 |
| 2007/0211532 | A1* | 9/2007 | Gonzalez | G06F 11/106 365/185.11 |
| 2007/0280001 | A1* | 12/2007 | Shields et al. | 365/185.29 |
| 2008/0106935 | A1* | 5/2008 | Kim et al. | 365/185.02 |
| 2012/0131262 | A1* | 5/2012 | He et al. | 711/103 |

\* cited by examiner

*Primary Examiner* — Duc Doan
(74) *Attorney, Agent, or Firm* — Eschweiler & Associates, LLC

(57) ABSTRACT

The disclosure relates to an electronic memory system, and more specifically, to a system to emulate an electrically erasable programmable read-only memory, and a method to emulate an electrically erasable programmable read-only memory. According to an embodiment of the disclosure, a system to emulate an electrically erasable programmable read-only memory is provided, the system including a first memory section and a second memory section, wherein the first memory section comprises a plurality of storage locations configured to store data partitioned into a plurality of data segments and wherein the second memory section is configured to store information mapping a physical address of a data segment stored in the first memory section to a logical address of the data segment.

18 Claims, 8 Drawing Sheets

FIG 1A

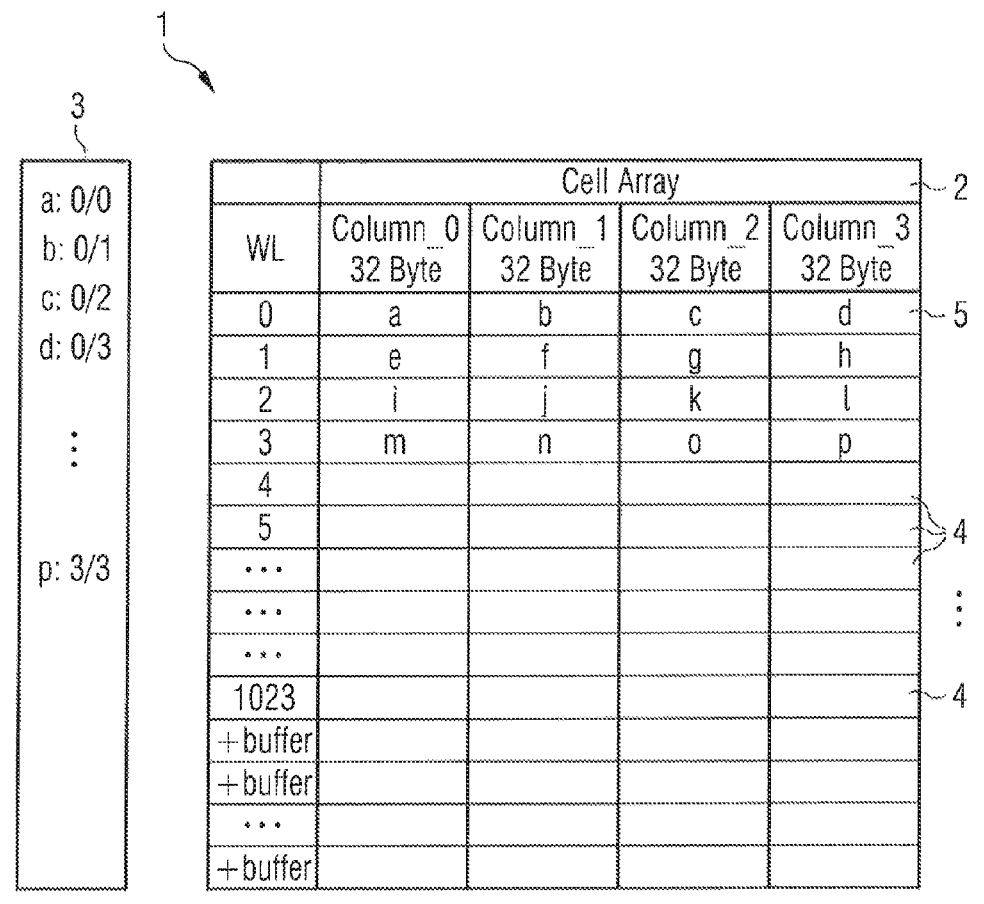

| | Cell Array | | | |
|---|---|---|---|---|
| WL | Column_0 32 Byte | Column_1 32 Byte | Column_2 32 Byte | Column_3 32 Byte |
| 0 | a | b | c | d |
| 1 | e | f | g | h |
| 2 | i | j | k | l |
| 3 | m | n | o | p |
| 4 | | | | |
| 5 | | | | |
| ... | | | | |
| ... | | | | |
| ... | | | | |
| 1023 | | | | |
| +buffer | | | | |
| +buffer | | | | |
| ... | | | | |
| +buffer | | | | | a: 0/0
b: 0/1
c: 0/2
d: 0/3
⋮
p: 3/3

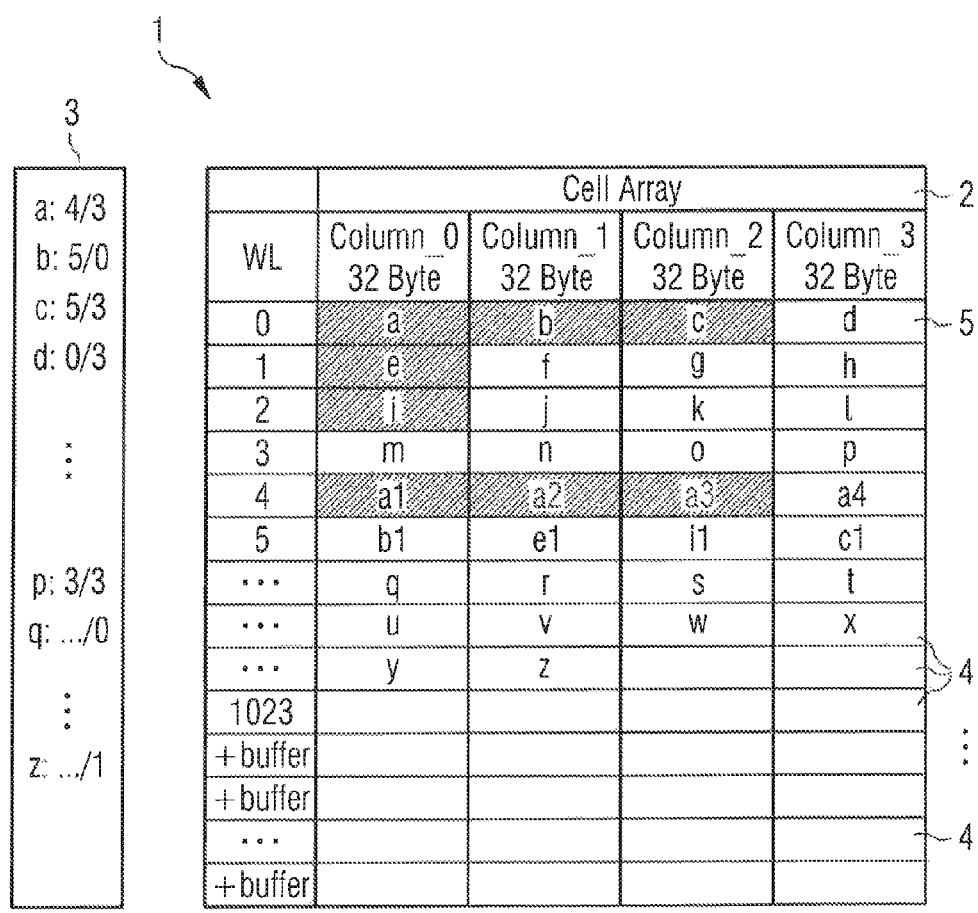

FIG 2

| WL-Driver | Status Bits | Column_0 32 Byte | Column_1 32 Byte | Column_2 32 Byte | Column_3 32 Byte |
|---|---|---|---|---|---|
| 0 | | D_00 | D_01 | D_02 | D_03 |
| 1 | | D_10 | D_11 | D_12 | D_13 |
| 2 | | D_20 | D_21 | D_22 | D_23 |
| 3 | | | | | |
| 4 | | | | | |
| 5 | | | | | |
| ... | | | | | |
| ... | | | | | |
| ... | | | | | |
| 1023 | | | | | |

FIG 3

| WL-Driver | Status Bits | Column_0 32 Byte | Column_1 32 Byte | Column_2 32 Byte | Column_3 32 Byte | Column_4 32 Byte | Column_5 32 Byte | Column_6 32 Byte | Column_7 32 Byte |
|---|---|---|---|---|---|---|---|---|---|
| 0 | | | | | | | | | |
| 1 | | | | | | | | | |
| 2 | | | | | | | | | |
| 3 | | | | | | | | | |
| 4 | | | | | | | | | |
| 5 | | | | | | | | | |
| ⋮ | | | | | | | | | |
| ⋮ | | | | | | | | | |
| 511 | | | | | | | | | |

FIG 4

| Column_0 32 Byte | Column_1 32 Byte | Column_2 32 Byte | Column_3 32 Byte | WL_Driver | Status Bits | Column_4 32 Byte | Column_5 32 Byte | Column_6 32 Byte | Column_7 32 Byte |
|---|---|---|---|---|---|---|---|---|---|
| | | | | 0 | | | | | |
| | | | | 1 | | | | | |
| | | | | 2 | | | | | |
| | | | | 3 | | | | | |
| | | | | 4 | | | | | |
| | | | | 5 | | | | | |
| | | | | ... | | | | | |
| | | | | ... | | | | | |
| | | | | 511 | | | | | |

SYSTEM AND METHOD TO EMULATE AN ELECTRICALLY ERASABLE PROGRAMMABLE READ-ONLY MEMORY

FIELD

The disclosure relates generally to an electronic memory system, and more specifically, to a system for emulating an electrically erasable programmable read-only memory in a non-volatile memory device, and a method of emulating an electrically erasable programmable read-only memory in a non-volatile memory device.

BACKGROUND

There is a wide variety of conventional non-volatile memory systems which are optimized for various fields of application. Based on the intended field of application, an appropriate memory system can be chosen. The properties of these conventional memory systems vary in many aspects. Two of these aspects are retention and endurance. Both are influenced by various factors such as the characteristics of individual memory cells of the memory system and by the architecture of the memory system.

Retention relates to a memory cell's ability to maintain the state it has been programmed to, i.e. to keep data stored in the memory cell intact. A memory system with high retention is able to store data over a long period of time without the need to refresh the data. In a memory system with low retention, data stored in the memory system has to be refreshed frequently.

Endurance relates to the number of times a memory cell can be erased or programmed. In a memory system with high endurance each memory cell of the memory system can be erased or programmed many times without being damaged. In contrast, in a memory system with low endurance, each memory cell can be erased or programmed only a limited number of times. Frequently erasing or programming a memory cell of a memory system with low endurance will damage the memory cell.

Generally, a conventional memory system exhibits either high retention or high endurance. When the retention of a memory system is high, the endurance of the memory system is generally low. Similarly, when the endurance of a memory system is high, the retention of the memory system is generally low. Therefore, in a situation where a memory system is employed to store data which needs to be updated only rarely, usually a memory system with high retention is employed. Correspondingly, in a situation where a memory system is employed to store data which is updated frequently, usually a memory system with high endurance is employed. Consequently, for a program memory which is used to store program data, it is convenient to use a memory system exhibiting high retention (and, consequently, low endurance), whereas for a data memory which is used to store application data, it is convenient to use a memory system exhibiting high endurance (and, consequently, low retention). An example for such a memory system with high endurance and low retention is an electrically erasable programmable read-only memory (EEPROM).

For many devices comprising a memory system, however, at the time the device is designed it is not known what type of data will later be stored in the memory system. Therefore, in these cases it is not possible to provide the device with the appropriate type of memory system. For example, a device comprising a memory system with high retention and low endurance is generally optimized to store program data. For a specific application of the device, however, it might be necessary to store application data in the memory system. In this case, the endurance of the memory system needs to be increased. This can be achieved by emulating a specific type of memory system using another type of memory system.

Conventional emulation schemes suffer from a number of drawbacks. Some of these schemes, for example, require an amount of memory space which is much larger than the amount of data which is to be stored in the memory system. With such a scheme it is impossible to build small and inexpensive memory systems. In other schemes the memory system has to provide several paths to access the memory for reading and programming. This again increases the space requirements of the memory system. Other schemes allow data to be programmed and erased only in big blocks and require a large number of erase operations. In most implementations this takes a lot of time.

For these or other reasons there is a need for improved systems and methods to emulate an electrically erasable programmable read-only memory.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and together with the description serve to explain the principles of the disclosure. Other embodiments of the present disclosure and many of the intended advantages of the present disclosure will be readily appreciated, as they become better understood by reference to the following detailed description.

FIG. 1a depicts a schematic representation of a memory system in accordance with an embodiment of the disclosure in a first state of programming;

FIG. 1b depicts a schematic representation of the memory system of FIG. 1a in a second state of programming;

FIG. 2 depicts a schematic representation of a memory system in accordance with another embodiment of the disclosure comprising a plurality of storage locations arranged in an array comprising four columns and 1024 rows;

FIG. 3 depicts a schematic representation of a memory system in accordance with another embodiment of the disclosure comprising a plurality of storage locations arranged in an array comprising eight columns and 512 rows;

FIG. 4 depicts a schematic representation of a memory system in accordance with another embodiment of the disclosure comprising a plurality of storage locations arranged in an array comprising eight columns and 512 rows with a word line driver arranged in the middle of each row;

DETAILED DESCRIPTION

Figure 1C:
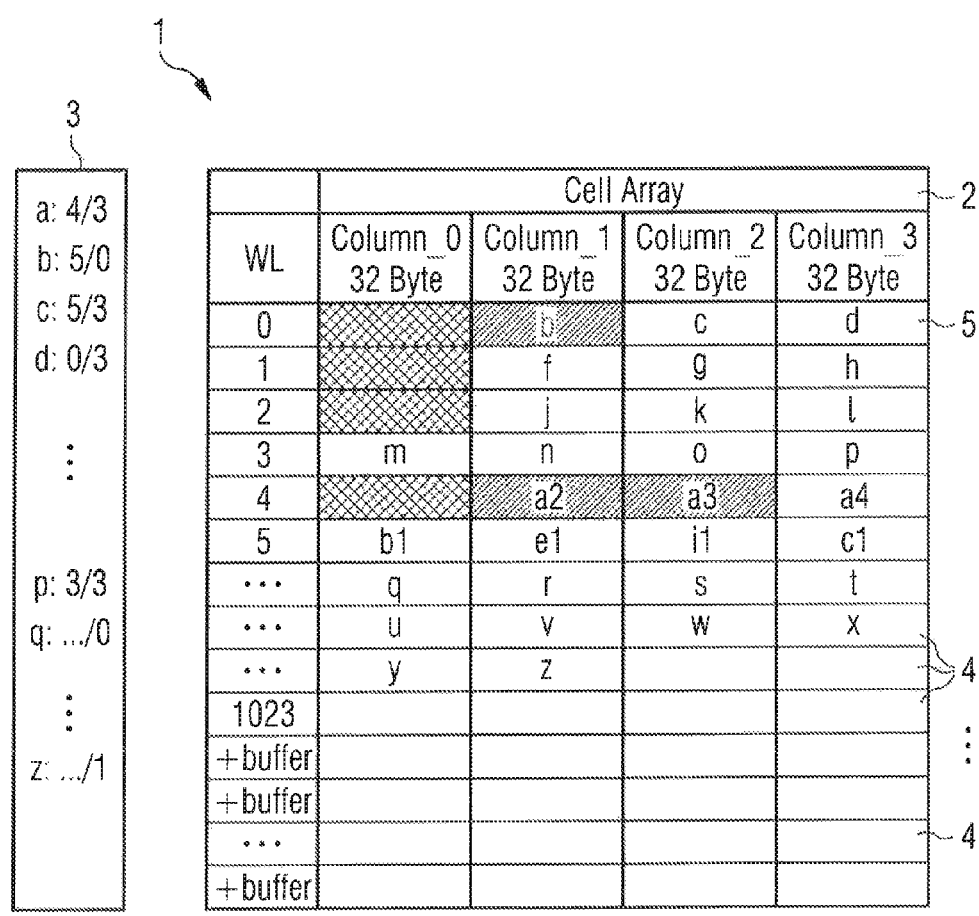
FIG. 1c depicts a schematic representation of the memory system of FIGS. 1a and 1b in a third state of programming.

In the following detailed description, reference is made to the accompanying drawings, which form a part hereof, and in which is shown by way of illustration specific embodiments in which the disclosure may be practiced. It is to be understood that other embodiments may be utilized and structural or other changes may be made without departing from the scope of the present disclosure. The following detailed description, therefore, is not to be taken in a limiting sense, and the scope of the present disclosure is defined by the appended claims.

FIG. 1a shows a schematic representation of a system 1 to emulate an EEPROM. The system 1 comprises a first memory section 2 and a second memory section 3. In one embodiment of the disclosure, the first memory section 2 comprises a non-volatile memory array and the second memory section 3 comprises a random-access memory (RAM). For example, the non-volatile memory array comprises a Flash memory. Advantageously, the second memory section 3 is configured to protect data stored in the second memory section 3 with an error-correcting code (ECC). The first memory section 2 comprises a cell array comprising a plurality of storage locations 4 arranged in a plurality of rows and columns. Each storage location comprises a plurality of memory cells. In the embodiment of FIG. 1a each storage location 4 of the first memory section 2 is adapted to store 32 Bytes of data. In another embodiment of the disclosure each storage location is adapted to store 16 Bytes of data. In yet another embodiment of the disclosure each storage location is adapted to store 64 Bytes of data. The cell array comprises four columns and 1024 rows of storage locations, i.e. 4096 storage locations of 32 Bytes each. Therefore, the cell array has a capacity of 128 kB. FIG. 1a shows, in one example, 16 data segments 5 ("a"-"p") stored in the cell array. The first data segment "a" is stored in the storage location provided in the first row and in the first column, the second data segment "b" is stored in the storage location provided in the first row and in the second column, and the last data segment "p" is stored in the storage location provided in the fourth row and in the fourth column.

The first memory section 2 furthermore comprises a plurality of word lines. Each row of storage locations 4 of the cell array is connected to one of these word lines, i.e. the first row of storage locations is connected to word line "0", the second row of storage locations is connected to word line "1", and the last row of storage locations is connected to word line "1023". In addition, the first memory section 2 comprises a plurality of storage locations which are designated as "+buffer" in FIG. 1a. In one embodiment, these storage locations are reserved for special purposes and are not used during normal EEPROM emulation.

The second memory section 3 of the system 1 to emulate an EEPROM is configured to store information mapping a physical address of a data segment stored in the first memory section 2 to a logical address of the data segment. As shown in FIG. 1a, the mapping information stored in the second memory section 3 indicates, for example, that data segment "a" is stored in the first row and in the first column ("0/0") of the cell array of the first memory section 2, that data segment "b" is stored in the first row and in the second column ("0/1") of the cell array of the first memory section 2, that data segment "d" is stored in the first row and in the fourth column ("0/3") of the cell array of the first memory section 2, and that data segment "p" is stored in the fourth row and in the fourth column ("3/3") of the cell array of the first memory section 2.

Providing the system 1 to emulate an EEPROM with a second memory section 3 which is configured to store information mapping a physical address of a data segment stored in the first memory section 2 to a logical address of the data segment allows the data segments stored in the first memory section 2 to be accessed via their logical addresses. The logical address of a data segment is independent of the actual storage location of the data segment in the first memory section, i.e. independent of the physical address of the data segment. In order to access a data segment in the first memory section 2 it is sufficient to know the logical address of the data segment, there is no need to know the physical address of the data segment. Introducing a logical address for each data segment 5 stored in the first memory section 2 allows the physical address of a data segment 5 to be changed during emulation. This change does not need to be communicated to the user of the system since the data segment 5 can still be accessed via its logical address which might be kept unchanged.

In one embodiment, when a data segment 5 stored in the first memory section 2 gets updated, the updated version of the data segment 5 is written to a new storage location 4. By writing updates of a data segment 5 to a new storage location 4, the endurance of the memory system can be enhanced. This is due to the fact that the update operations will be spread across several storage locations, thus reducing the number of times a single storage location is accessed for updating.

In addition, in one embodiment each data segment 5 comprises an indicator indicating the version of the data segment 5. This is shown, for example, in FIG. 1b which shows the memory system 1 of FIG. 1a after some of the data segments 5 stored in the first memory section 2 have been updated and additional data segments 5 have been written to the first memory section 2. In particular, in the configuration of the memory device 1 shown in FIG. 1b, data segment "a" has been updated four times. The first update was marked as "a1" and was written to the storage location provided in the fifth row and in the first column ("4/0") of the cell array of the first memory section 2. The second update was marked as "a2" and was written to the storage location provided in the fifth row and in the second column ("4/1") of the cell array of the first memory section 2. The third update was marked as "a3" and was written to the storage location provided in the fifth row and in the third column ("4/2") of the cell array of the first memory section 2. The fourth update was marked as "a4" and was written to the storage location provided in the fifth row and in the fourth column ("4/3") of the cell array of the first memory section 2. When an updated version of a data segment is written to the first memory section 2, the previous version of this data segment could generally be erased. In the embodiment of FIGS. 1a-1c, however, a deprecated data segment is not immediately erased but instead gets marked for erasing. In FIG. 1b this is indicated by shading of data segments. Since the current version of data segment "a" is marked as "a4", this data segment is not shaded in FIG. 1b. The previous versions of this data segment, i.e. the data segments marked "a", "a1", "a2", and "a3", are marked for erasing and are therefore shown shaded in FIG. 1b.

Data segments "b", "c", "e", and "i" have been updated once. The current versions of these data segments are therefore marked "b1", "c1", "e1", and "i1" and the deprecated data segments have been marked for erasing. Furthermore, several new data segments, i.e. the data segments "q", "r", . . . , "z" have been written to the first memory section 2.

The updates to the data stored in the first memory section 2 are reflected in the mapping information stored in the second memory section 3. As shown in FIG. 1b, this mapping information now indicates, for example, that the current version of data segment "a" is stored in row "4" and column "3" of the cell array of the first memory section 2, the current version of data segment "b" is stored in row "5" and column "0" of the cell array of the first memory section 2, and current version of data segment "c" is stored in row "5" and column "3" of the cell array of the first memory section 2.

The memory system of the disclosure is configured to monitor, for each row and for each column of the cell array of the first memory section, the number of data segments marked for erasing in the respective row or column. Furthermore, in one embodiment the memory system is configured to simultaneously erase all data segments of a row or a column which are marked for erasing whenever the number of data segments marked for erasing in the row or in the column reaches an erase threshold. By simultaneously erasing all deprecated data segments of a row or a column whenever the number of deprecated data segments in this row or this column reaches an erase threshold, the number of erase operations which have to be performed during emulation of the EEPROM can be reduced. If, for example, the erase threshold is set to four, in each erase operation four data segments will be erased simultaneously. Therefore, compared to an emulation scheme in which each data segment is erased as soon as it becomes outdated, with the emulation scheme of the disclosure the number of erase operations can be reduced by 75%. This is particularly advantageous since in most memory systems it takes quite some time to perform an erase operation. Setting the erase threshold to a higher value reduces the number of erase operations even further. The higher the erase threshold, however, the higher the number of storage locations in the cell array of the first memory section required to store a given amount of data.

In the configuration of the memory system 1 shown in FIG. 1b, monitoring the number of data segments marked for erasing in each row and in each column indicates that: in row "0" three data segments are marked for erasing; in row "1" one data segment is marked for erasing; in row "2" one data segment is marked for erasing; in row "4" three data segments are marked for erasing; in column "0" four data segments are marked for erasing; in column "1" two data segments are marked for erasing; and in column "2" two data segments are marked for erasing. When the erase threshold is set to four, the system 1 will recognize that the number of data segments marked for erasing in column "0" has reached the erase threshold. Therefore, the system 1 will now erase all data segments in column "0" which are marked for erasing, i.e. the data segments in rows "0", "1", "2", and "4". After these data segments have been erased, the corresponding storage locations are again available for storing fresh data. This situation is shown in FIG. 1c which indicates that four data segments of column "0" have been erased. When data segments which were marked for erasing are being erased, the mapping information stored in the second memory section 3 does not need to be updated. This mapping information relates only to valid data segments and is therefore not affected by the erasing of deprecated data segments. Therefore, the mapping information stored in the second memory section 3 in the configuration of the memory system 1 shown in FIG. 1c is the same as in the configuration shown in FIG. 1b.

In the embodiment of the memory system 1 shown in FIGS. 1a-1c each column of the cell array of the first memory section 2 is located on a separate well, i.e. the first memory section 2 comprises four wells, with each of the columns of the cell array located on one of these wells. By providing a separate well for each column of storage locations it can be ensured that data segments marked for erasing in one of the columns can be erased without erasing data segments in other columns. Generally, in one embodiment a data segment is erased by applying a first voltage to the word line connected to the storage location of the data segment and by applying a second voltage to the well the storage location is arranged in. Therefore, in the configuration of the memory system 1 shown in FIG. 1b the data segments marked for erasing in column "0" are erased by applying a first voltage to word lines "0", "1", "2", and "4" and a second voltage to the well of column "0".

To erase all data segments marked for erasing in a specific row, a first voltage is applied to the word line connected to the storage locations of these data segments and to the wells the storage locations are arranged in. Therefore, in order to erase all data segments marked for erasing in row "4", for example, in the configuration of the memory system 1 shown in FIG. 1b a first voltage is applied to the word line "4" and a second voltage is applied to the wells of columns "0", "1", and "2".

The cell array of the first memory section 2 of the system 1 shown in FIGS. 1a-1c comprises four columns and 1024 rows. Therefore, if the erase threshold is set to four, the cell array can comprise at most 12 data segments marked for erasing before the erase threshold is reached: Each of the four columns can contain three data segments marked for erasing (4×3=12). In this configuration, the erase threshold is not reached unless four of these data segments are located in a single row. With the next data segment which gets marked for erasing the number of data segments marked for erasing will reach four in the next data segment's column. At that time 13 data segments will be marked for erasing. Next, four of these data segments will get erased. The cell array will then contain nine data segments marked for erasing. Therefore, in this example embodiment of the disclosure, in order to store a certain amount of data in the first memory section, the cell array of the first memory section has to contain a number of storage locations adding up to this amount of data plus at least 12 additional storage locations.

If, in the embodiment of the disclosure shown in FIGS. 1a-1c, the erase threshold is set to eight, the cell array can comprise at most 28 data segments marked for erasing before the erase threshold is reached: Each of the four columns can contain seven data segments marked for erasing (4×7=28). The next data segment which gets marked for erasing will bring the number of data segments marked for erasing to eight in one of the columns. Therefore, in this case, at least 28 additional storage locations have to be provided in the cell array. If the erase threshold is set to eight instead of four, however, the number of erase operations can be further reduced because in each erase operation eight data segments will be erased simultaneously whereas with the erase threshold set to four only four data segments will be erased simultaneously.

According to another embodiment of the disclosure the system to emulate an EEPROM is configured to monitor, for each storage location of the non-volatile memory array, the number of times the storage location has been accessed for writing or erasing. Advantageously, the system then selects, when writing a data segment to a storage location in the first memory section, a storage location for which the number of times the storage location has been accessed for writing or erasing does not exceed a preset threshold. In this way it can be ensured that write- and erase-operations are evenly distributed across the cell array. Since, as mentioned above, in a non-volatile memory system, in particular in a Flash memory system, each storage location can be accessed for writing or erasing only a limited number of times, distributing write- and erase-operations evenly across the memory system is particularly advantageous.

If, in the memory system 1 shown in FIG. 1*c*, a new data segment "zz" needs to be written to the first memory section 2, basically any empty storage location could be used, i.e. either a storage location that has been erased previously (such as storage location "0/0") or a storage location that has not been written to at all (such as storage location "1023/0"). Before the system selects storage location "0/0" for writing data segment "zz" to the cell array, the system checks the number of times storage location "0/0" has been accessed for writing or erasing. If this number does not exceed a preset threshold, the system will continue to write data segment "zz" to storage location "0/0". If, however, this number does exceed the preset threshold, the system will choose another storage location, for example storage location "1023/0". Advantageously, the preset threshold is gradually increased during operation of the memory system 1.

According to another embodiment of the disclosure, the system 1 maintains an access table recording, for each storage location of the first memory section, the number of times the storage location has been accessed for writing or erasing and status information indicating whether the storage location is ready to receive data. In one embodiment, when a data segment needs to be written to the first memory section, the system then selects from the access table the storage location with the lowest number of write-/erase-accesses. If this storage location is ready to receive data, the data segment will be written to this storage location. If the storage location is not ready to receive data, the system will select the storage location with the second lowest number of write-/erase-accesses and will again check whether the storage location is ready to receive data. This process will continue until a storage location has been found which is ready to receive data. The data segment will then be written to this storage location.

Generally, in a non-volatile memory system data is read, written, or erased by applying voltages to various components of the memory system, such as the word lines, bit lines, and wells of the memory system. Due to the layout of a conventional non-volatile memory system, during a read-, write-, or erase-operation, these voltages are usually not only applied to the memory cells which are accessed for reading, writing, or erasing, but also to other memory cells of the non-volatile memory system. As a result, memory cells of a non-volatile memory system receive voltage stress during read-, write-, and erase-operations. This voltage stress is commonly referred to as "disturb". There are several types of disturb, such as "read disturb", "write disturb", or "erase disturb", which are also referred to as "gate disturb" or "well disturb". A memory cell which receives many disturbs may get corrupted, i.e. the data value stored in the memory cell might be changed erroneously.

In one embodiment of the disclosure the system to emulate an EEPROM is configured to monitor, for each data segment stored in the non-volatile memory array, the number of disturbs the data segment has received. In one embodiment the system is configured to monitor several types of disturb. Alternatively, the system is configured to monitor a single type of disturb. In one embodiment, this single type of disturb is the type of disturb which, for the specific architecture and layout of the memory system in accordance with the disclosure, has the highest potential of compromising data integrity. In one embodiment of the disclosure, the system is configured to monitor well disturbs.

By monitoring the number of disturbs the data segments stored in the non-volatile memory array receive, the system in accordance with the disclosure can prevent data segments from getting corrupted by receiving an excessive number of disturbs. In one embodiment the system is configured to move a data segment to a new storage location in the non-volatile memory array when the number of disturbs the data segment has received exceeds a disturb threshold. This will ensure that a data segment is moved to a new storage location before it receives an excessive number of disturbs and therefore helps to maintain data integrity.

FIG. 2 shows a schematic representation of the first memory section 2 of a memory system in accordance with another embodiment of the disclosure. The first memory section 2 in this embodiment is very similar to the first memory section of FIGS. 1*a*-1*c* and again comprises a non-volatile memory array comprising a plurality of storage locations arranged in rows and columns. The non-volatile memory array comprises four columns and 1024 rows of storage locations with each storage location adapted to store 32 Bytes of data. In addition, the first memory section 2 comprises a column of storage locations 6 adapted to store, for each row of the non-volatile memory array, a plurality of status bits. In one embodiment these status bits are used to store counters, such as a disturb counter, in particular a well disturb counter. In addition, the status bits may be used to record status information indicating whether the cluster has been properly erased.

Furthermore, the first memory section 2 shown in FIG. 2 comprises a plurality of word line drivers 7. A word line driver is coupled to each word line of the non-volatile memory array. Since the non-volatile memory array comprises 1024 rows of storage locations, the first memory section 2 comprises 1024 word line drivers. The word line drivers 7 are located in the leftmost position of the first memory section 2 in one embodiment.

FIG. 3 shows a schematic representation of the first memory section 2 of a memory system in accordance with another embodiment of the disclosure. In this embodiment, the non-volatile memory array comprises eight columns and 512 rows of storage locations with each storage location adapted to store 32 Bytes of data, i.e. the total capacity of the non-volatile memory array of FIG. 3 is the same as the total capacity of the non-volatile memory array of FIG. 2. The word line drivers 7 are again located in the leftmost position of the first memory section 2. Generally, in a non-volatile memory system the optimal length of the word lines and the bit lines depends on various parameters, such as the width and the length of the memory cells, or the resistance or capacitance of the word lines and bit lines. FIGS. 2 and 3 illustrate that the layout of the memory system in accordance with the disclosure can be flexibly adapted to the physical dimensions of the memory array.

FIG. 4 shows a schematic representation of the first memory section 2 of a memory system in accordance with another embodiment of the disclosure. In this embodiment, the non-volatile memory array again comprises eight columns and 512 rows of storage locations with each storage location adapted to store 32 Bytes of data. The word line drivers 7, however, are centrally located in the non-volatile memory array. In particular, the word line drivers 7 are positioned between column "3" and column "4". As a result, each word line is split into two segments with a single word line driver coupled to both segments. By splitting each word line into two segments the length of the word lines is reduced. Therefore, this placement of the word line drivers 7 improves time efficiency of operations involving application of voltages via the word lines.

Figure 5:
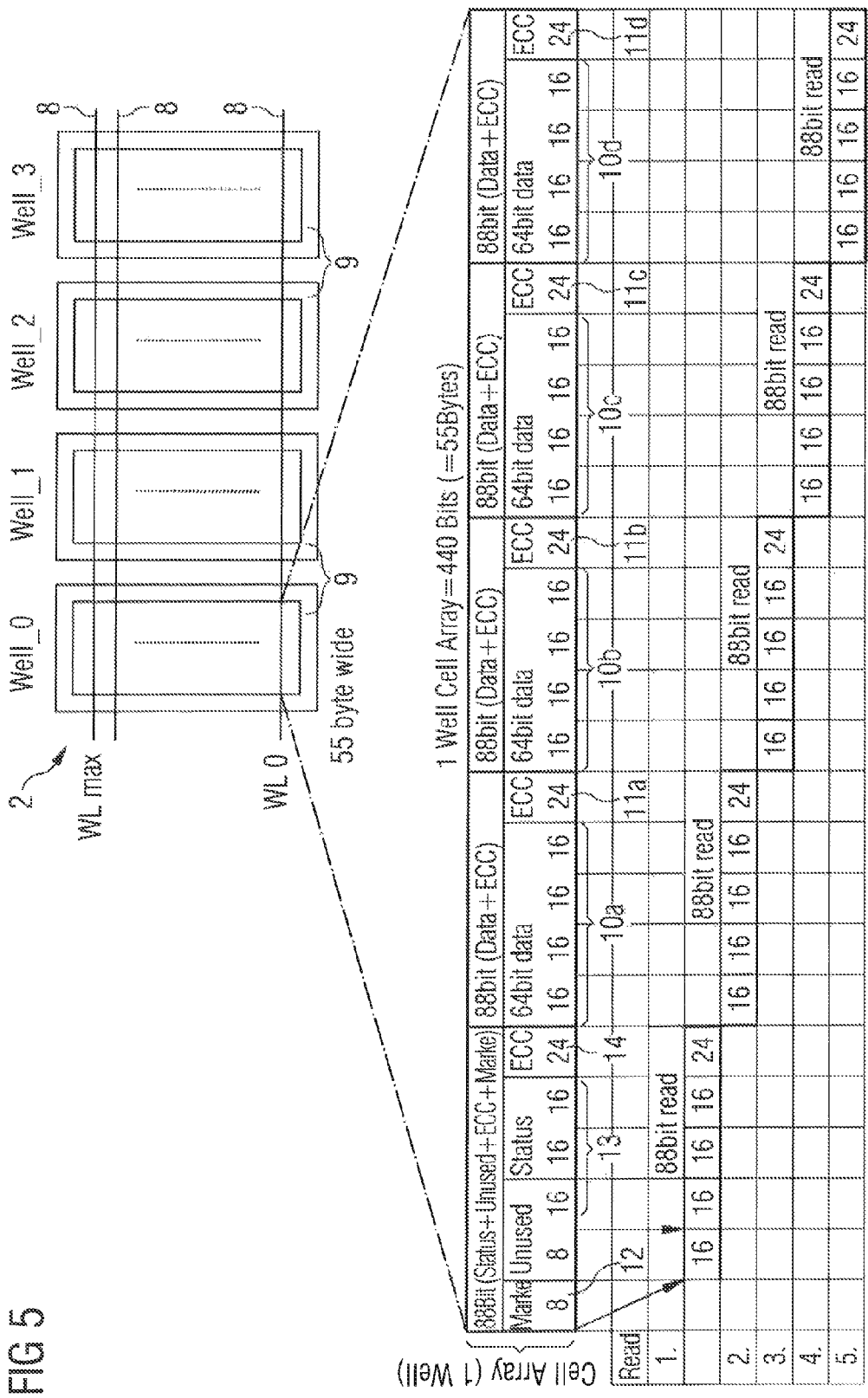
FIG. 5 depicts a schematic representation of a memory system in accordance with another embodiment of the disclosure and of a data structure associated with this memory system.

FIG. 5 shows a schematic representation of the first memory section 2 of a memory system in accordance with another embodiment of the disclosure and of a data structure associated with this memory system. The first memory section 2 is similar to the first memory sections of FIGS. 1*a*-1*c* and 2 and comprises a plurality of storage locations arranged in an array of rows and columns. The memory array comprises four columns with each of the columns arranged on a separate well 9. Therefore, the first memory section 2 comprises four wells 9. Furthermore, the first memory section 2 comprises a plurality of word lines 8. Each word line 8 is coupled to a row of storage locations.

Each storage location is configured to store 32 Bytes of user data. The lower part of FIG. 5 shows one example data structure in accordance with an embodiment of the disclosure to store these 32 Bytes of user data. The 32 Bytes of user data are partitioned into four data segments: a first data segment 10*a*, a second data segment 10*b*, a third data segment 10*c*, and a fourth data segment 10*d*. Each of these data segments comprises 64 bits (4×16 bit) of user data and is protected by an associated ECC 11*a*-11*d* comprising 24 bits. Therefore, each of the four data segments 10*a*-10*d* together with the associated ECC 11*a*-11*d* requires 88 bits of storage space. Another block of 88 bits is provided to store marker bits 12 (8 bits), status bits 13 (3×16 bits=48 bits), and another ECC 14 (24 bits). 8 bits of this block are unused. The resulting data structure, which is used to store 32 Bytes of user data, comprises 440 bits (5×88 bits=55 Bytes). By storing 32 Bytes of user data in a 55 Byte data structure, user data can be stored very efficiently in the memory system in accordance with the disclosure. The storage efficiency is much better than the efficiency of typical conventional systems which use, for example, 88 Bytes to store 32 Bytes of user data.

Figure 6:
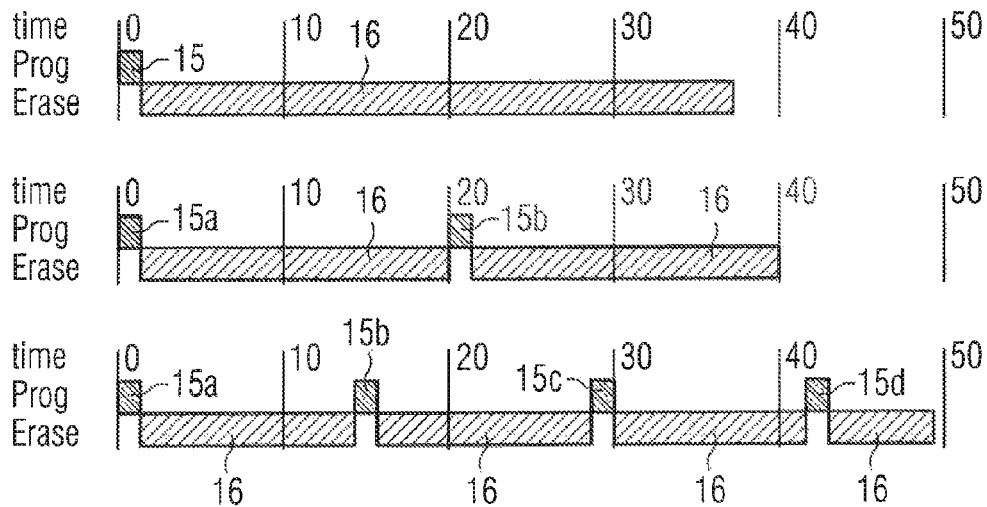
FIG. 6 depicts timing diagrams of a method to emulate an electrically erasable programmable read-only memory in accordance with another embodiment of the disclosure.

In one embodiment of the disclosure the system to emulate an EEPROM is configured to interrupt an ongoing erase operation when it receives a request to program data to the memory system and to automatically resume the interrupted erase operation after the program operation has been completed. This is shown in one example in the three timing diagrams of FIG. 6. The first diagram shows that the system performs a short program operation 15 which is followed by an erase operation 16. Although the time specifications in FIG. 6 are only symbolic, the diagram shows that the erase operation 16 takes much longer than the program operation 15.

In the second diagram two program operations are performed. The system starts again with a first program operation 15*a* which is followed by an erase operation 16. Before the erase operation 16 has been completed, the system receives a request to perform a second program operation 15*b*. Therefore, the ongoing erase operation 16 is interrupted and the second program operation 15*b* is performed. After the second program operation 15*b* has been completed, the erase operation 16 is resumed and is finally completed. Since the erase operation 16 was interrupted, it is completed later than in the scenario of the first diagram.

In the third diagram, four program operations are performed. The system starts again with a first program operation 15*a* which is followed by an erase operation 16. Before the erase operation 16 has been completed, the system receives a request to perform a second program operation 15*b*. Therefore, the ongoing erase operation 16 is interrupted and the second program operation 15*b* is performed. After the second program operation 15*b* has been completed, the erase operation 16 is resumed. Subsequently, the erase operation 16 is again interrupted to perform the third program operation 15*c*, is then resumed again, interrupted again to perform the fourth program operation 15*d* and resumed again to be finally completed. Since the erase operation 16 was interrupted three times, it is completed later than in the scenarios of the first or second diagram.

In one embodiment of the disclosure the system to emulate an EEPROM is configured to provide at least three operating modes. In a first operating mode, which might be referred to as "Standard Mode", the system allows data segments to be read or updated. In this operating mode, a certain latency may be needed before read execution because an already running erase needs to be suspended. In a second operating mode, which might be referred to as "Fast Read Mode", the system provides a special read functionality with particularly short access time. This short read access time is achieved by prohibiting update, program, or erase operations in the second operating mode. Therefore, update, program, or erase operations cannot be performed in the second operating mode. Since program or erase operations are not allowed in the second operating mode, no program or erase suspend is necessary before a read operation can be performed. This operating mode is particularly suitable for read bursts. In a third operating mode, which might be referred to as "Fast Update Mode", the system allows data segments to be read or updated. In this operating mode, old data segments are not erased. Therefore, in this operating mode very fast programming rates can be achieved, since new data segments are directly written to the memory system without erasing of old data segments. Depending on the architecture of the memory system, this operating mode may be limited to a certain small buffer size, e.g. 8 KB. In the memory system of FIGS. 1*a*-1*c*, in this operating mode new data segments are preferably written to the storage locations identified as "+buffer", i.e. to the last rows of the cell array of the first memory section 2.

Figure 7:
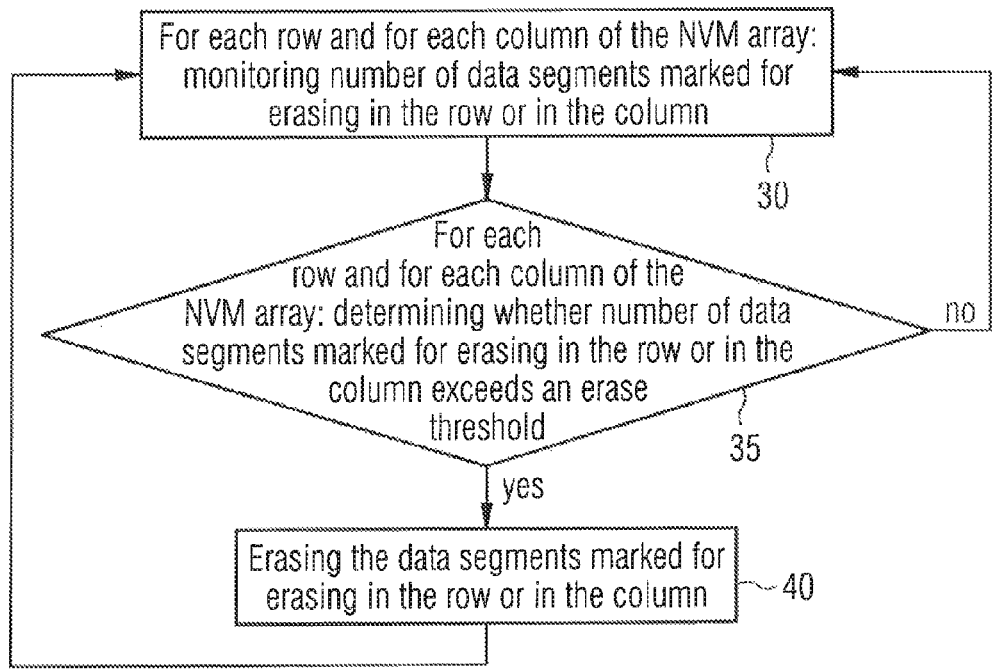
FIG. 7 depicts steps performed in a method to emulate an electrically erasable programmable read-only memory in accordance with another embodiment of the disclosure.

FIG. 7 shows steps performed in a method to emulate an electrically erasable programmable read-only memory in accordance with an embodiment of the disclosure. The method comprises the acts of: for each row and for each column of the non-volatile memory array: monitoring the number of data segments marked for erasing in the row or in the column (act 30); for each row and for each column: determining whether the number of data segments marked for erasing in the row or in the column exceeds an erase threshold (act 35). If the response to act 35 is no, repeat act 30; if yes at 35, erasing the data segments marked for erasing in the row or in the column (act 40). Then the method returns to act 30. By performing these acts, the number of erase operations performed during EEPROM emulation can be reduced since in each erase operations several data segments are erased simultaneously. As a result, the performance of the EEPROM emulation is enhanced.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A system, comprising:
a first memory section; and
a second memory section,
the system configured to emulate an electrically erasable programmable read-only memory if data is to be stored with high endurance,
wherein the first memory section comprises a plurality of storage locations configured to store the data partitioned into a plurality of data segments and wherein the second memory section is configured to store information mapping a physical address of a data segment of the plurality of data segments stored in the first memory section to a logical address of the data segment,
wherein the system is configured to erase all data segments stored in a particular row or a particular column of the first memory section and marked for erasing as soon as the number of data segments marked for erasing in the particular row or the particular column of the first memory section reaches a predetermined threshold.

2. The system of claim 1, wherein the first memory section comprises a non-volatile memory array.

3. The system of claim 2, wherein the second memory section comprises a random access memory (RAM).

4. The system of claim 2, wherein the first memory section is configured to be accessed for reading, writing, and erasing of a data segment via a single access path.

5. The system of claim 2, wherein the system is configured to monitor, for each data segment stored in the non-volatile memory array, a number of disturbs the data segment has received.

6. The system of claim 5, wherein the system is configured to move a data segment to a new storage location in the non-volatile memory array when the number of disturbs the data segment has received exceeds a disturb threshold.

7. The system of claim 2, wherein the system is configured to mark a data segment in the non-volatile memory array which is to be erased as marked for erasing.

8. The system of claim 2, wherein the system is configured to monitor, for each storage location of the non-volatile memory array, a number of times the data segment has been accessed for writing or erasing.

9. The system of claim 1, wherein the second memory section is configured to protect data stored in the second memory section with an error-correcting code.

10. The system of claim 1, wherein each column is arranged on a separate well.

11. A method to store data in a memory device comprising a plurality of storage locations, the method comprising:
emulating an electrically erasable programmable read-only memory, comprising:
storing a plurality of data segments of the data in a first memory section of the memory device;
for each data segment stored in the first memory section: storing mapping information in a second memory section mapping a physical address of the storage location of the data segment in the first memory section to a logical address; and
erasing all data segments stored in a particular row or a particular column of the first memory section and marked for erasing as soon as the number of data segments marked for erasing in the particular row or the particular column of the first memory section reaches a predetermined threshold.

12. The method of claim 11, further comprising:
monitoring, for each storage location of the first memory section, a number of times the storage location has been accessed for writing or erasing.

13. The method of claim 12, further comprising:
selecting, when writing a data segment to a storage location in the first memory section, a storage location for which the number of times the storage location has been accessed for writing or erasing does not exceed a preset threshold.

14. The method of claim 11, further comprising:
monitoring, for each data segment stored in the first memory section, a number of disturbs the data segment has received.

15. The method of claim 14, further comprising:
moving a data segment to a new storage location in the first memory section when the number of disturbs the data segment has received exceeds a disturb threshold.

16. A method to emulate an electrically erasable programmable read-only memory in a memory system that comprises a non-volatile memory array comprising a plurality of storage locations arranged in an array of rows and columns and a random access memory (RAM), the method comprising:
storing a plurality of data segments in the non-volatile memory array;
storing mapping information in the RAM that maps a physical address of the storage location of the data segment in the non-volatile memory array to a logical address; and
erasing all data segments stored in a particular row or a particular column of the storage location and marked for erasing as soon as the number of data segments marked for erasing in the particular row or the particular column of the storage location reaches a predetermined threshold.

17. The method of claim 16, further comprising:
marking a data segment as marked for erasing when the data segment is accessed for erasing.

18. The method of claim 17, further comprising:
monitoring, for each data segment stored in the non-volatile memory array, a number of disturbs the data segment has received; and
when the number of disturbs a data segment has received exceeds a disturb threshold: moving the data segment to a new storage location in the non-volatile memory array.

* * * * *